(12) United States Patent
Schultz

(10) Patent No.: US 7,524,693 B2
(45) Date of Patent: Apr. 28, 2009

(54) METHOD AND APPARATUS FOR FORMING AN ELECTRICAL CONNECTION TO A SEMICONDUCTOR SUBSTRATE

(75) Inventor: Peter S. Schultz, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 277 days.

(21) Appl. No.: 11/383,659

(22) Filed: May 16, 2006

(65) Prior Publication Data

US 2007/0269926 A1 Nov. 22, 2007

(51) Int. Cl.
- H01L 21/00 (2006.01)
- H01L 21/50 (2006.01)
- H01L 21/48 (2006.01)
- H01L 21/44 (2006.01)
- H01L 29/84 (2006.01)
- H01L 29/82 (2006.01)

(52) U.S. Cl. ............... 438/50; 438/51; 438/48; 438/106; 257/414; 257/415; 257/416; 257/417; 257/E27.122

(58) Field of Classification Search ............ 438/48, 438/50, 51, 106; 257/414, 415, 416, 417, 257/E27.122

See application file for complete search history.

(56) References Cited

U.S. PATENT DOCUMENTS

| | | | | | |
|---|---|---|---|---|---|
| 5,721,446 | A | * | 2/1998 | Kobayashi | 257/419 |
| 6,025,767 | A | * | 2/2000 | Kellam et al. | 335/128 |
| 6,074,891 | A | * | 6/2000 | Staller | 438/53 |
| 6,323,550 | B1 | * | 11/2001 | Martin et al. | 257/704 |
| 6,530,515 | B1 | * | 3/2003 | Glenn et al. | 228/214 |
| 6,852,926 | B2 | * | 2/2005 | Ma et al. | 174/539 |
| 7,138,293 | B2 | * | 11/2006 | Ouellet et al. | 438/106 |
| 7,262,622 | B2 | * | 8/2007 | Zhao | 324/763 |
| 7,419,853 | B2 | * | 9/2008 | Kuhmann et al. | 438/113 |
| 2005/0205951 | A1 | * | 9/2005 | Eskridge | 257/416 |
| 2007/0096227 | A1 | * | 5/2007 | Lim et al. | 257/416 |

* cited by examiner

*Primary Examiner*—Luan C Thai
(74) *Attorney, Agent, or Firm*—Susan C. Hill

(57) ABSTRACT

A device (100) may use one or more conductive elements (112) to electrically couple a substrate (116) and a cap (114). In one embodiment, an acceleration sense element may be formed on the substrate (116), and the cap (114) may be used to provide hermetic protection to the acceleration sense element. In one embodiment, conductive elements (112) may be formed by dispensing conductive die attach material. Wire bonds (e.g. 322) bonded to bond pads (e.g. 332) on the substrate (e.g. 316) may be used to couple substrate (116), the conductive element pad (335), and the cap (114), to a desired predetermined potential.

20 Claims, 2 Drawing Sheets

METHOD AND APPARATUS FOR FORMING AN ELECTRICAL CONNECTION TO A SEMICONDUCTOR SUBSTRATE

RELATED APPLICATION

This is related to U.S. patent application Ser. No. 11/158,793, filed Jun. 21, 2005, entitled "SUBSTRATE CONTACT FOR A CAPPED MEM SYSTEM AND METHOD OF MAKING THE SUBSTRATE CONTACT AT THE WAFER LEVEL", which is assigned to the current assignee hereof, and which is hereby incorporated by reference.

FIELD OF THE INVENTION

The present invention relates generally to a semiconductor substrate, and more particularly to forming an electrical connection to a semiconductor substrate.

RELATED ART

With the consumer market demanding smaller and smaller devices, reducing the size of integrated circuits, sensors, MEMS (micro-electro-mechanical systems), etc. and their associated packaging has become extremely important.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
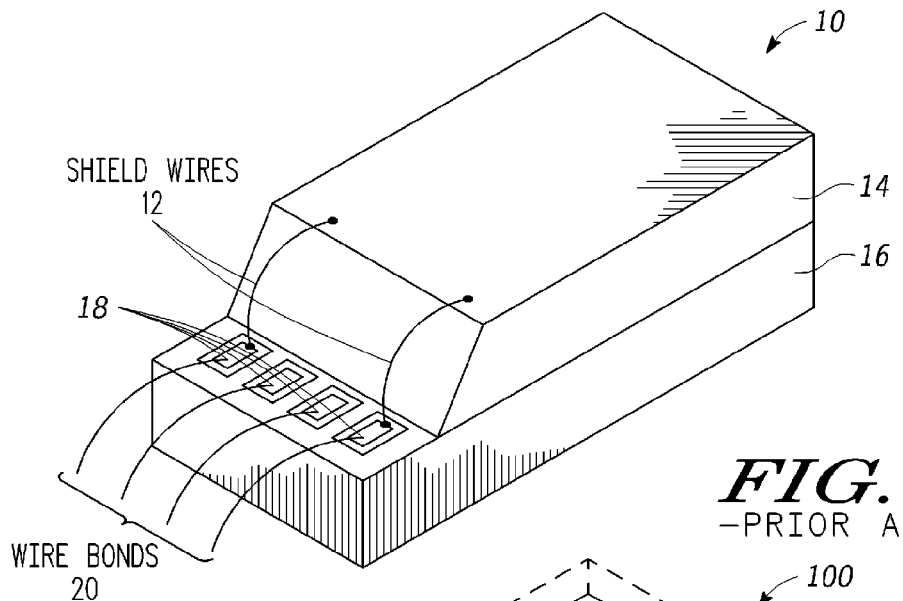
FIG. 1 illustrates a three-dimensional view of a device in accordance with the prior art.

FIG. 1 (prior art) illustrates a three-dimensional view of a device 10 which includes a substrate 16 having bond pads 18. Cap wafer 14 is placed overlying substrate 16. Substrate 16 includes an acceleration sense element. Shield wires 12 electrically couple cap wafer 14 and bond pads 18. Wire bonds 20 electrically couple bond pads 18 to application specific points (not shown). Note that shield wires 12 electrically couple substrate 16 and cap wafer 14 via their associated bond pads.

Figure 2:
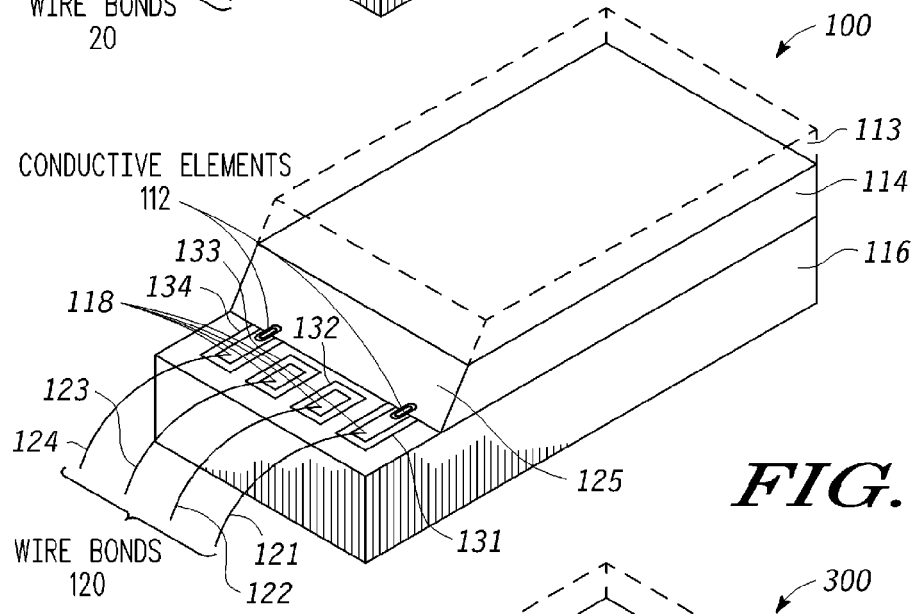
FIG. 2 illustrates a three-dimensional view of a device in accordance with one embodiment of the present invention.

FIG. 2 illustrates a three-dimensional view of a device 100 which includes a substrate 116 having bond pads 118. Cap wafer 114 is placed overlying substrate 116. Substrate 116 includes an acceleration sense element covered and protected by cap wafer 114. U.S. patent application Ser. No. 11/158,793, filed Jun. 21, 2005, entitled "SUBSTRATE CONTACT FOR A CAPPED MEM SYSTEM AND METHOD OF MAKING THE SUBSTRATE CONTACT AT THE WAFER LEVEL", which is assigned to the current assignee hereof, and which is hereby incorporated by reference, describes one possible embodiment of an acceleration sense element (e.g. see MEMS sensor in FIGS. 1 and 2). Alternate embodiments of device 100 may incorporate any type of device or structure on substrate 116, such as, for example, any type of circuitry, sensors or MEMS devices. Alternate embodiments are not limited as to what circuitry or structures may be formed on substrate 116.

Note that shield wires are not required to electrically couple cap wafer 114 and bond pads 118. Instead, conductive elements 112 are used to electrically couple cap wafer 114 and bond pads 118. This may produce a significant advantage. Referring to FIG. 1, shield wires 12 generally protrude above cap wafer 14; thus, device 10 has a taller profile than device 100. In addition, cap wafer 114 no longer requires that shield wires (e.g. shield wires 12 of FIG. 1) be coupled to the top surface of cap wafer 114. As a result, cap wafer 114 may be reduced in height (e.g. by grinding, etching, etc.) by an amount 113. This may produce a significant reduction in the overall height of device 100 as compared to device 10 (see FIG. 1). In addition, grinding or etching cap wafer 14 (see FIG. 1) is not possible due to the fact that cap wafer 14 must have a conductive metal layer on the top surface for bonding to shield wires 12. Such grinding would remove the metal conductive layer on the top surface that must be in place when cap wafer 14 is bonded to substrate 16.

Still referring to FIG. 2, wire bonds 120 electrically couple bond pads 118 to application specific points. For example, wire bonds 122 and 123 may be used to communicate input and/or output signals to sensors or circuitry on substrate 116. Wire bonds 121 and 124 may be used to electrically couple both cap wafer 114 and substrate 116 to a predetermined potential. Alternate embodiments may not have wire bonds 121 and 124 if another mechanism is used to control the potential of substrate 116 and cap wafer 114. Note that conductive elements 112 ensure that the potential of substrate 116 and cap wafer 114 are approximately the same. One advantage to ensuring that substrate 116 and cap wafer 114 are kept at approximately the same potential is that electrical fields that may adversely affect circuitry and devices in this area are reduced.

In one embodiment, conductive elements 112 may be formed using standard equipment that is used to dispense die attach material. Note that if a device (not shown) electrically coupled to one or more of wire bonds 120 is mounted using conductive die attach, this same die attach may be used to form conductive elements 112. Note that for some embodiments, the amount of die attach material required by conductive elements 112 is significantly less than the amount generally used for die attach. Alternate embodiments may use other types of conductive adhesives, ball bonds, solder connections, conductive adhesive tape, or any other desired conductive material. Alternate embodiments may even use semiconductor materials for conductive elements 112. In one embodiment, conductive elements 112 comprise at least one material selected from a group consisting of a conductive adhesive, a conductive epoxy, and a metal.

Note that in the illustrated embodiment, bond pads 118 on substrate 116 may be placed in relative proximity to the edge of cap wafer 114 to enable efficient and more reliable connections to be made by conductive elements 112. Note that in some embodiments, edge 125 of cap wafer 114 may be angled and/or may have a conductive layer formed on the surface. Both the angle and the top conductive layer may improve the reliability of the connections made by conductive elements 112. Alternate embodiments may not angle edge 125, or may angle edge 125 in a different manner. Alternate embodiments may not have a conductive layer on the top surface of edge 125. Note that in the illustrated embodiment, bond pads 131 and 134 need to be large enough to accommodate both wire bonds 120 and conductive elements 112, while bond pads 132 and 133 need to be large enough to accommodate only wire bonds 120 and not conductive elements 112. However, some embodiments may make bond pads 118 all the same size for ease of processing. Alternate embodiments may not even use bond pads (e.g. 118), but instead may use some other mechanism to allow conductive elements 112 to electrically connect substrate 116 and cap wafer 114. Note that bond pads 131 and 134 are electrically coupled to substrate 116, while bond pads 122 and 123 may be electrically isolated from substrate 116.

Note that although layer 114 has been referred to herein as a "cap wafer", in alternate embodiments, cap wafer 114 may be any type of at least partially conductive material which may or may not comprise circuitry, sensors, MEMS, or other structures. In the illustrated embodiment, the "cap wafer" is a protective layer. In one embodiment, the cap wafer 114 hermetically seals a portion of the top surface of substrate 116 while also providing a conductive or semiconductive layer for shielding.

Figure 3:
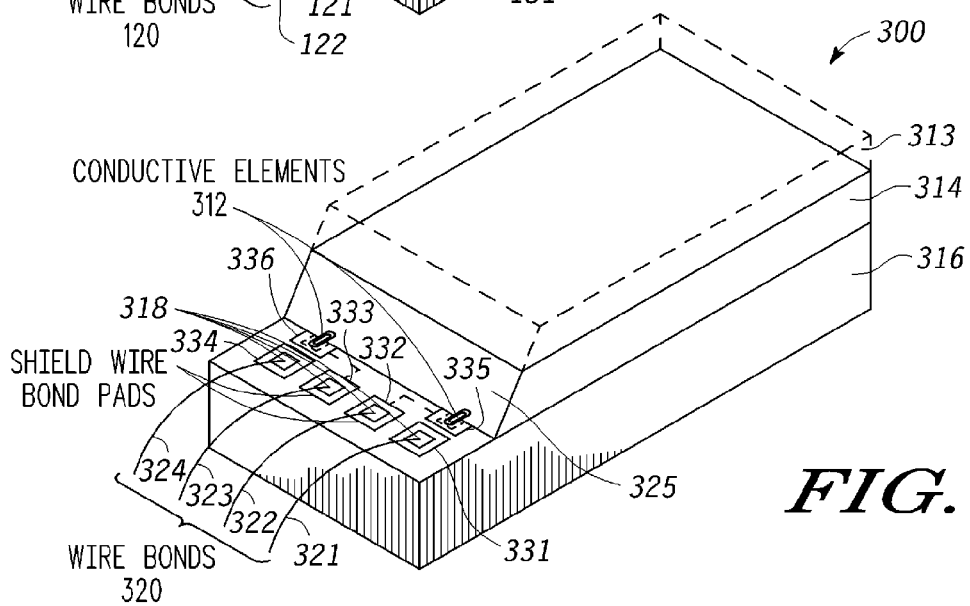
FIG. 3 illustrates a three-dimensional view of a device in accordance with an alternate embodiment of the present invention.

FIG. 3 illustrates a three-dimensional view of a device 300 which includes a substrate 316 having bond pads 318. Cap wafer 314 is placed overlying substrate 316. Substrate 316 includes an acceleration sense element covered and protected by cap wafer 314. Alternate embodiments may incorporate any type of device or structure on substrate 316, such as, for example, any type of circuitry, sensors or MEMS devices. Alternate embodiments are not limited as to what circuitry or structures may be formed on substrate 316.

Note that shield wires are not required to electrically couple cap wafer 314 and bond pads 335 & 336. Instead, conductive elements 312 are used to electrically couple cap wafer 314 and bond pads 335 & 336. This may produce a significant advantage. Referring to FIG. 1, shield wires 12 generally protrude above cap wafer 14; thus, device 10 has a taller profile than device 300. In addition, cap wafer 314 no longer requires that shield wires (e.g. shield wires 12 of FIG. 1) be coupled to the top surface of cap wafer 314. As a result, cap wafer 314 may be reduced in height (e.g. by grinding, etching, etc.) by an amount 313. This may produce a significant reduction in the overall height of device 300 as compared to device 10 (see FIG. 1).

Still referring to FIG. 3, additional pads 335 and 336 have been added for the purpose of making electrical contact between the conductive elements 312 and substrate 316. The dotted lines represent electrical conductors formed in or on substrate 316 which are used to electrical couple pad 335 and 336 to pads 332 and 333, respectively. Note that a redundant electrical connection between 335 and 336 may or may not be made by substrate 316, by wire bonds 320, or in any other desired manner. Wire bonds 320 electrically couple bond pads 318 to application specific points. For example, wire bonds 321 and 324 may be used to communicate input and/or output signals to sensors or circuitry on substrate 316. Wire bonds 322 and 323 may be used to electrically couple both cap wafer 314 and substrate 316 to a predetermined potential. Alternate embodiments may not have wire bonds 322 and 323 if another mechanism is used to control the potential of substrate 316 and cap wafer 314. Note that conductive elements 312 ensure that the potential of substrate 316 and cap wafer 314 are approximately the same. One advantage to ensuring that substrate 316 and cap wafer 314 are kept at approximately the same potential is that electrical fields that may adversely affect circuitry and devices in this area are reduced.

In one embodiment, conductive elements 312 may be formed using standard equipment that is used to dispense die attach material. Note that if a device (not shown) electrically coupled to one or more of wire bonds 320 is mounted using conductive die attach, this same die attach may be used to form conductive elements 312. Note that for some embodiments, the amount of die attach material required by conductive elements 312 is significantly less than the amount generally used for die attach. Alternate embodiments may use other types of conductive adhesives, ball bonds, solder connections, conductive adhesive tape, or any other desired conductive material. Alternate embodiments may even use semiconductor materials for conductive elements 312. In one embodiment, conductive elements 312 comprise at least one material selected from a group consisting of a conductive epoxy and a metal.

Note that in the illustrated embodiment, bond pads 335 and 336 on substrate 316 may be placed in relative proximity to the edge of cap wafer 314 to enable efficient and more reliable connections to be made by conductive elements 312. Note that in some embodiments, edge 325 of cap wafer 314 may be angled and/or may have a conductive layer formed on the surface. Both the angle and the top conductive layer may improve the reliability of the connections made by conductive elements 312. Alternate embodiments may not angle edge 325, or may angle edge 325 in a different manner. Alternate embodiments may not have a conductive layer on the top surface of edge 325. Note that in the illustrated embodiment, bond pads 321-324 do not need to be large enough to accommodate both wire bonds 320 and conductive elements 312. Note that bond pads 332 and 333 are electrically coupled to substrate 316, while bond pads 331 and 334 may be electrically isolated from substrate 316. Bond pads 335 and 336 are electrically coupled to substrate 316, either directly, or by way of bond pads 332 and 333, or both.

Note that although layer 314 has been referred to herein as a "cap wafer", in alternate embodiments, cap wafer 314 may be any type of at least partially conductive material which may or may not comprise circuitry, sensors, MEMS, or other structures. In the illustrated embodiment, the "cap wafer" is a protective layer. In one embodiment, the cap wafer 314 hermetically seals a portion of the top surface of substrate 316 while also providing a conductive or semiconductive layer for shielding.

Figure 4:
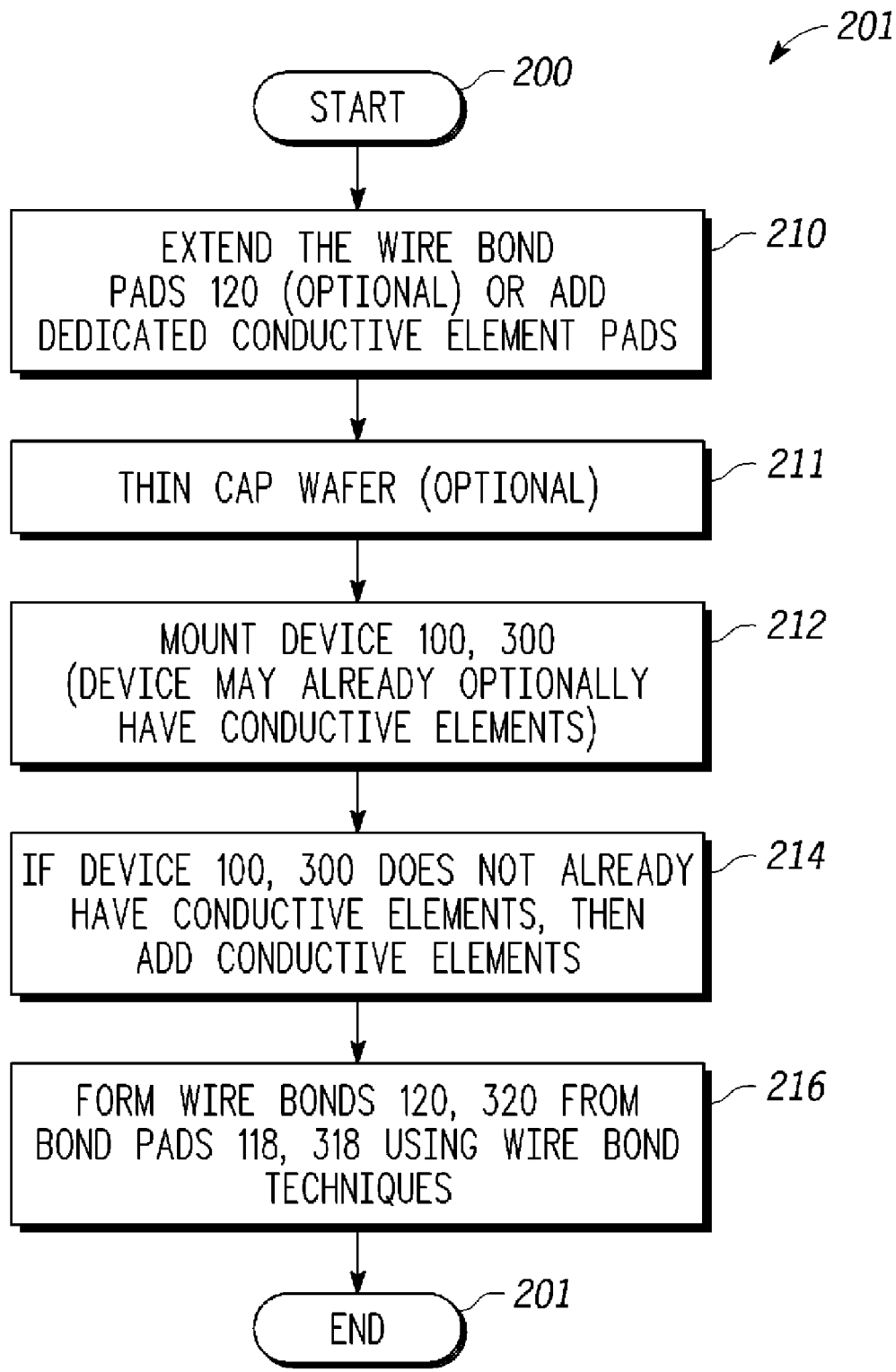
FIG. 4 illustrates, in flow diagram form, a method in accordance with one embodiment of the present invention.

FIG. 4 illustrates, in flow diagram form, a flow 201 in accordance with one embodiment of the present invention. In the illustrated embodiment, flow 201 starts at start oval 200 and proceeds to box 210 where the step performed is "extend the wire bond pads 120 (optional) or add dedicated conductive element pads" such as, for example, bond pads 335 and 336 (see FIG. 3). FIG. 2 illustrates an example of extending or increasing the size of bond pads 131 and 134 to accommodate both conductive elements 112 and wire bonds 121 and 124. FIG. 3 illustrates an example of adding additional pads 335 and 336 for coupling to conductive elements 312. In the example in FIG. 3, the location and size of wire bond pads 318 may remain unchanged. Instead, pads 335 and 336 are used for the electrical connection to conductive elements 312.

From box 210, flow 201 proceeds to box 211 where the step performed is "thin cap wafer (optional)". FIG. 2 illustrates that cap 114 may be thinned (e.g. by grinding) to reduce the height of cap 114 by an amount 113. Similarly, FIG. 3 illustrates that cap 314 may be thinned to reduce the height of cap 314 by an amount 313. This thinning of the cap wafer (114, 314) is optional and may not be performed for some embodiments.

From box 211, flow 201 proceeds to box 212 where the step performed is "mount device 100, 300 (device may already optionally have conductive elements)". Referring to FIG. 2, conductive elements 112 may be formed or disposed on device 100 before or after device 100 is mounted to a package flag or substrate. This package flag or substrate may be a portion of the final housing for device 100 and any associated devices (not shown). Referring to FIG. 3, conductive elements 312 may be formed or disposed on device 300 before or after device 300 is mounted to a package flag or substrate. This package flag or substrate may be a portion of the final housing for device 300 and any associated devices (not shown). From box 212, flow 201 proceeds to box 214 where the step performed is "if device 100, 300 does not already have conductive elements, then add conductive elements". Again, conductive elements 112, 312 may be formed or disposed on the device 100, 300 before or after device 100, 300 is mounted.

From box 214, flow 201 proceeds to box 216 where the step performed is "form wire bonds 120, 320 from bond pads 118, 318 using wire bond techniques". From box 216, flow 201 proceeds to end oval 201 where flow 201 ends. Note that flow 201 illustrates only one possible method that may be used. A wide variety of alternate methods may be used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Note that the term "couple" has been used to denote that one or more addition conductive elements may be interposed between two elements that are coupled. For example, referring to FIG. 2, an additional conductive layer may be interposed between wire bond 121 and bond pads 131.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming an electrical connection to a semiconductor substrate, comprising:
   providing a pad on the semiconductor substrate;
   placing a cap overlying the semiconductor substrate, wherein the cap has a top surface, and wherein the cap has a side edge which forms a non-perpendicular angle with respect to a top surface of the semiconductor substrate; and
   forming a first conductive element to electrically couple the semiconductor substrate and the cap,
   wherein the first conductive element overlies a first portion of the non-perpendicular angle, and
   wherein no portion of the first conductive element is located on the top surface of the cap.

2. A method as in claim 1, wherein the cap comprises at least a portion of a semiconductor wafer.

3. A method as in claim 1, wherein the first conductive element comprises conductive die attach material.

4. A method as in claim 1, further comprising: grinding the cap.

5. A method as in claim 4, wherein grinding the cap reduces a thickness of the cap, and wherein no portion of the first conductive element is formed overlying the top surface of the cap after grinding.

6. A method as in claim 1, further comprising:
   forming a second conductive element to electrically couple the semiconductor substrate and the cap,
   wherein the second conductive element overlies a second portion of the non-perpendicular angle.

7. A method as in claim 1, wherein no conductive pads are located on the top surface of the cap.

8. A method as in claim 1, wherein the pad on the semiconductor substrate comprises a bond pad for wire bonding.

9. A method as in claim 1, wherein the step of forming the first conductive element comprises forming the first conductive element less than all of a way up the side edge of the cap from the top surface of the semiconductor substrate to the top surface of the cap.

10. A device, comprising:
    a semiconductor substrate having a first bond pad;
    a cap overlying the semiconductor substrate, the cap having a top surface and a side edge; and
    a first conductive element disposed on at least a portion of the first bond pad and at least a first portion of the side edge of the cap to thereby electrically couple the semiconductor substrate to the cap,
    wherein no portion of the first conductive element overlies the top surface of the cap.

11. A device as in claim 10, wherein the first conductive element comprises conductive die attach.

12. A device as in claim 10, wherein the first conductive element comprises a ball bond.

13. A device as in claim 10, wherein the first conductive element comprises at least one material selected from a group consisting of a conductive adhesive, a conductive epoxy, and a metal.

14. A device as in claim 10, wherein the device comprises a micro-electro-mechanical device.

15. A device as in claim 10, wherein the cap hermetically seals at least a portion of the semiconductor substrate.

16. A device as in claim 10, further comprising:
    a second bond pad on a surface of the semiconductor substrate; and
    a second conductive element disposed on at least a portion of the second bond pad and at least a second portion of the side edge of the cap to thereby electrically couple the semiconductor substrate to the cap.

17. A device as in claim 10, further comprising:
    a wire bond attached to the first bond pad.

18. A device as in claim 10, wherein the side edge of the cap forms a non-perpendicular angle with a top surface of the semiconductor substrate, and wherein a thickness of the cap is reduced by etching the top surface of the cap.

19. A device as in claim 10, wherein the first conductive element comprises no wire bonds.

20. A micro-electro-mechanical device, comprising:
    a substrate comprising an acceleration sense element and a first bond pad;
    a cap comprising at least a portion of a semiconductor wafer, said cap overlying the semiconductor substrate and providing hermetic protection for the acceleration sense element, said cap having a top surface devoid of bond pads; and a conductive element disposed on at least a portion of the first bond pad and at least a first portion of the cap to thereby electrically couple the semiconductor substrate to the cap, wherein the at least the portion of the first bond pad is formed in a first plane, wherein the at least the first portion of the cap is formed in a second plane that is different from the first plane, and wherein the first plane and the second plane are angled and not parallel with respect to each other.

* * * * *